(12) United States Patent
Woo et al.

(10) Patent No.: US 10,714,367 B2
(45) Date of Patent: Jul. 14, 2020

(54) FUME-REMOVING DEVICE

(71) Applicant: Bum Je Woo, Seongnam (KR)

(72) Inventors: Bum Je Woo, Seongnam (KR); Sang Hyun Kim, Yongin (KR); Myoung Sok Han, Yongin (KR); Young Chul Kim, Yongin (KR)

(73) Assignee: Bum Je Woo, Seongnam (KR)

( * ) Notice: Subject to any disclaimer, the term of this patent is extended or adjusted under 35 U.S.C. 154(b) by 0 days.

(21) Appl. No.: 15/986,479

(22) Filed: May 22, 2018

(65) Prior Publication Data

US 2018/0277410 A1    Sep. 27, 2018

Related U.S. Application Data

(63) Continuation of application No. 15/113,221, filed as application No. PCT/KR2015/000461 on Jan. 16, 2015.

(30) Foreign Application Priority Data

Jan. 21, 2014  (KR) ........................ 10-2014-0007368

(51) Int. Cl.
  *H05K 5/00*  (2006.01)
  *H01L 21/673*  (2006.01)
  *H01L 21/677*  (2006.01)

(52) U.S. Cl.
  CPC .... *H01L 21/67389* (2013.01); *H01L 21/6732* (2013.01); *H01L 21/67383* (2013.01); *H01L 21/67393* (2013.01); *H01L 21/67724* (2013.01)

(58) Field of Classification Search
  CPC .......... H01L 21/67389; H01L 21/6732; H01L 21/67383; H01L 21/67393; H01L 21/67724
  (Continued)

(56) References Cited

U.S. PATENT DOCUMENTS 6,363,626 B1    4/2002  Fiorillo et al.
8,315,052 B2   11/2012  Chan et al.
(Continued)

FOREIGN PATENT DOCUMENTS

JP    1990-127035     10/1990
JP    11-251422 A     9/1999
(Continued)

OTHER PUBLICATIONS

English translation of Abstract of KR-100989887B1.*
(Continued)

*Primary Examiner* — Helena Kosanovic

(57) ABSTRACT

The present invention relates to an apparatus for removing fume which includes, a wafer cassette for stacking wafers; and an exhaust for exhausting the fume of the wafers stacked in the wafer cassette, wherein the wafer cassette includes stacking shelves provided at both sides for stacking wafers; and a front opening for incoming and outgoing of the wafers which are being stacked in the stacking shelf, wherein the stacking shelves include multiple inclined ramp portions which are slanted towards the wafers stacked in the stacking shelves as they travel towards the front opening, wherein a purge gas outlet is provided in the inclined ramp portion for supplying purge gas for the wafers stacked in the stacking shelves. According to the present invention, the residual process gases on wafers can be removed efficiently.

2 Claims, 13 Drawing Sheets

(58) Field of Classification Search
USPC .......................................................... 454/187
See application file for complete search history.

(56) References Cited

U.S. PATENT DOCUMENTS

| | | |
|---|---|---|
| 2014/0206204 A1 | 7/2014 | Nakagawa |
| 2015/0364346 A1 | 12/2015 | Woo |

FOREIGN PATENT DOCUMENTS

| | | |
|---|---|---|
| JP | 11-312725 A | 11/1999 |
| JP | 2000-340637 A | 12/2000 |
| JP | 2001-007192 A | 1/2001 |
| JP | 2002-110760 A | 4/2002 |
| JP | 2003-347397 A | 12/2003 |
| JP | 2004-179449 A | 6/2004 |
| JP | 2006-108145 A | 4/2006 |
| JP | 2008-141098 A | 6/2008 |
| JP | 2009-509316 A | 3/2009 |
| JP | 2009-523325 A | 6/2009 |
| JP | 2011-060877 A | 9/2009 |
| JP | 2013-128091 A1 | 6/2013 |
| KR | 10-1999-0037214 A | 5/1999 |
| KR | 20-0280366 Y1 | 7/2002 |
| KR | 200280366 Y1 | 7/2002 |
| KR | 10-0567433 B1 | 3/2006 |
| KR | 20060100992 A | 9/2006 |
| KR | 10-0678475 B1 | 1/2007 |
| KR | 10-0830654 B1 | 5/2008 |
| KR | 10-2009-0061311 A | 6/2009 |
| KR | 10-0989887 B1 | 10/2010 |
| KR | 100989887 B1 | 10/2010 |
| KR | 100989887 B1 * | 10/2010 |
| KR | 10-2011-0082833 A | 7/2011 |
| KR | 10-1098990 B1 | 12/2011 |
| KR | 10-2013-0076129 A | 7/2013 |
| KR | 10-1294143 B1 | 8/2013 |
| KR | 10-2015-0045083 A | 4/2015 |
| TW | 533174 B | 5/2003 |
| TW | 201001599 A | 1/2010 |
| TW | 201138001 A | 11/2011 |
| WO | WO-2008008270 A2 * | 1/2008 ....... H01L 21/67383 |

OTHER PUBLICATIONS

Chinese Office Action for Application No. 201580004841.2, dated Apr. 11, 2018.
Office Action dated Oct. 30, 2019 in related U.S. Appl. No. 15/986,501.
Office Action with English Translation received in JP Application No. 2016-548255 dated May 30, 2017; 12 pages.
Office Action with English Translation received in TW Application No. 1 041 01826 dated Jan. 6, 2017; 35 pages.
International Search Report, dated Jun. 12, 2015 for PCT Application No. PCT/KR2015/000461.

* cited by examiner

FUME-REMOVING DEVICE

CROSS-REFERENCE TO RELATED APPLICATION

This application is a continuation of U.S. patent application Ser. No. 15/113,221 filed Jul. 21, 2016, which is a U.S. National Stage Application of PCT/KR2015/000461 filed Jan. 16, 2015, which claims priority Korean Patent Application 10-2014-0007368 filed Jan. 21, 2014, the disclosures of which are incorporated herein by reference.

TECHNICAL FIELD

The present invention relates to an apparatus for removing fume

BACKGROUND ART

Generally, a semiconductor manufacturing process includes photolithography, deposition, etching, and the like, and most of these processes are performed being filled with a process gas.

Most of the process gas is exhausted during the process. However, some part of the gas still remains on the wafer surface damaging the wafer or contaminating the process equipments.

For solving the foresaid problems, a wafer treatment apparatus, wherein a fume removing function is built-in the EFEM cassette, is disclosed in Korean Patent No. 10-1294143 previously filed and registered by the present applicant.

However, the foresaid wafer treatment apparatus is disadvantageous in that the entire fume on the wafer surface may not be removed uniformly.

(Patent Literature 1) Korean Patent No. 10-1294143 B1

SUMMARY OF INVENTION

Technical Problem

The present invention provides an apparatus for removing fume which removes residual process gas on a wafer.

Solution to Problem

An apparatus for removing fume according to an exemplary embodiment of the present invention includes: a wafer cassette for stacking wafers; and an exhaust for exhausting the fume of the wafers stacked in said wafer cassette, wherein said wafer cassette includes: stacking shelves provided at both sides for stacking wafers; and a front opening for incoming and outgoing of the wafers which are being stacked in said stacking shelf, wherein said stacking shelves include multiple inclined ramp portions which are slanted towards the wafers stacked in said stacking shelves as they travel towards said front opening, wherein a purge gas outlet may be provided in said inclined ramp portion for supplying purge gas for the wafers stacked in said stacking shelves.

The space between the stacking selves provided at both sides when viewing from said front opening may be smaller than the diameter of the wafer being stacked in said wafer cassette.

A number of said purge gas exhausts are provided, and at least part of them are provided in said inclined ramp portion, and said stacking self further includes purge gas flow paths for flowing said purge gas incoming to said stacking self to said purge gas exhaust. Said purge gas flow paths further includes a main flow path and a number of branch flow paths which are branched from said main flow path into a number of individual purge gas outlets, and each of said branch flow paths may be arranged to have a obtuse angle with said main flow path.

A number of said purge gas outlets are provided, and at least part of them are provided in said inclined ramp portion, wherein a number of said purge gas outlets may be provided such that the diameter of said purge gas outlet which is arranged closer to said front opening is relatively larger than those of the other purge gas outlets.

Said stacking shelves are vertically spaced apart such that the wafers can be vertically stacked inside said wafer cassette. Said purge gas outlets are provided for each stacking shelf which is vertically spaced apart such that the purge gas can be supplied to each wafer vertically stacked.

Said stacking shelf may further include a pin for supporting a wafer.

Said wafer cassette may be provided such that at least a part thereof is transparent.

A punching plate, provided at the back surface, communicating with said wafer cassette and said exhaust, wherein said punching plate may include an array of air suction holes whose widths is getting wider as it travels towards the top area.

Said exhaust may include a compressed air exhauster which controls the exhausting air pressure of the fume accumulated in said wafer cassette by supplying compressed air.

A tube communicating with the exhausting gas pressure sensor for detecting the exhausting pressure of the fume is provided inside of said compressed air exhauster. The end of said tube may be provided in such a way that it would point towards the exhausting direction of the fume exhausted through said compressed air exhauster.

A first sensor may further be included inside said wafer cassette for detecting whether any wafer exists therein.

A second sensor may further be included for detecting whether the wafers stacked in the wafer cassette are stacked in right locations.

An illumination unit may further be included for illuminating the inside of said wafer cassette.

A heating member may be further included for heating the inside of said wafer cassette, wherein said heating member may include: an upper heater provided on the upper surface of the case of said wafer cassette; a lower heater provided on the lower surface of the case of said wafer cassette; and rod heaters provided on the sides of the case of said wafer cassette.

An apparatus for removing fume according to another exemplary embodiment of the present invention includes: a body; a wafer cassette detachably provided in said body for stacking wafers; and an exhaust provided in said body for exhausting fume of the wafers stacked inside said wafer cassette, wherein said wafer cassette includes: a case for surrounding the wafers stacked in said wafer cassette from top to bottom and sides; stacking shelves provided at both sides and vertically spaced apart from each other for stacking multiple wafers; and a punching plate, provided at the back surface of said case, communicating with said wafer cassette and said exhaust, wherein said stacking shelves includes purge gas outlets individually provided for each stacking shelf plurally organizing said stacking shelves for supplying purge gas; and the purge gas may be exhausted through said punching plate by flowing between the stacked wafers without leaking to the outside of said wafer cassette.

Said stacking shelves may further include pins for minimizing the wafer supporting area.

Said stacking shelves may be formed to have a width corresponding to the space between the wafers being stacked on said pins and the space between the two sides of said case.

A bezel may further be included for preventing inflow of the purge gas into the space between said wafer cassette and said body by connecting said wafer cassette and said body.

A base plate, provided between said wafer cassette and said body and capable of adjusting the horizontal level, may be further included, wherein said wafer cassette may be detachably settled down on said base plate.

Said wafer cassette may further include a digital leveler outputting an abnormal signal if the horizontal level is not appropriate when settling down on said base plate.

Said body includes a purge gas inlet hole for supplying purge gas from the outside. Said wafer cassette includes a purge gas inlet coupler having a shape corresponding to said purge gas inlet hole, and is being selectively coupled with said purge gas inlet hole. When said purge gas inlet coupler is coupled with said purge gas inlet hole, purge gas may be exhausted to said purge gas outlet of said stacking shelf via said purge gas inlet coupler.

Said purge gas outlet includes a protrusion, and said purge gas inlet coupler includes a groove having a shape corresponding to said protrusion. When said purge gas inlet coupler is coupled to said purge gas inlet hole, said protrusion can be inserted into said groove.

Casters capable of rotation and levelers for fixing said body through the vertical movements thereof may be installed at the bottom of said body.

An interface unit is provided at the external side of said body, and said interface unit may include a display unit for displaying the operating states.

Said interface unit may further include a communication port capable of external communications.

A fume outlet for communicating said wafer cassette and said exhausts is provided in said body, and the position of said fume outlets may be variable.

An apparatus for removing fume according to another exemplary embodiment of the present invention includes: a wafer cassette for stacking wafers; and an exhaust for exhausting the fume of the wafers stacked in said wafer cassette, wherein said wafer cassette includes: stacking shelves provided at both sides for stacking wafers; and a purge gas inlet hole provided in said stacking shelf for supplying the purge gas to the wafers stacked in said stacking shelves, wherein said exhaust may include a compressed air exhauster for controlling the exhausting speed of the fume accumulated in said wafer cassette by supplying fluids.

Said compressed air exhauster may include: a compressed air outlet through which the supplied fluids are flowing into said compressed air exhauster; and a compressed air transition area which is formed such that the supplied fluids are uniformly flowing into said compressed air outlet.

Said compressed air exhauster may further include an expanded portion which is being expanded towards the exhausting direction of said fume in order to direct the direction of fluids flowing in through said compressed air outlet.

The size of said compressed air outlet may be varied.

A regulator for controlling the pressure of the fluid supplied by said compressed air exhauster; and an exhaust gas pressure sensor for detecting the exhausting pressure of the fume may be further included, wherein said regulator can be controlled by comparing the exhausting pressure of the fume measured by said exhaust gas pressure sensor with the atmospheric pressure.

A tube is provided inside said compressed air exhauster for communicating with said exhaust gas pressure sensor, and the end portion of said tube is provided such that it would be headed for the direction of the fume which is being exhausted through said compressed air exhauster.

A punching plate, which includes multiple air suction holes communicating with said exhaust, is provided in said wafer cassette. The wafer fume having passed through said punching plate may flow to said exhaust guided by the upper hopper having at least partially a streamline shape.

The fume being flowed to said exhaust guided by said upper hopper may be re-guided by the lower hopper of the exhaust and exhausted.

Advantageous Effects of Invention

According to the present invention, the residual process gases on wafers can be removed efficiently.

BRIEF DESCRIPTION OF DRAWINGS

FIG. 13 is a block diagram for explaining the flow path of the purge gas, the compressed air, and the fume inside an

DETAILED DESCRIPTION OF EMBODIMENT

Figure 1:
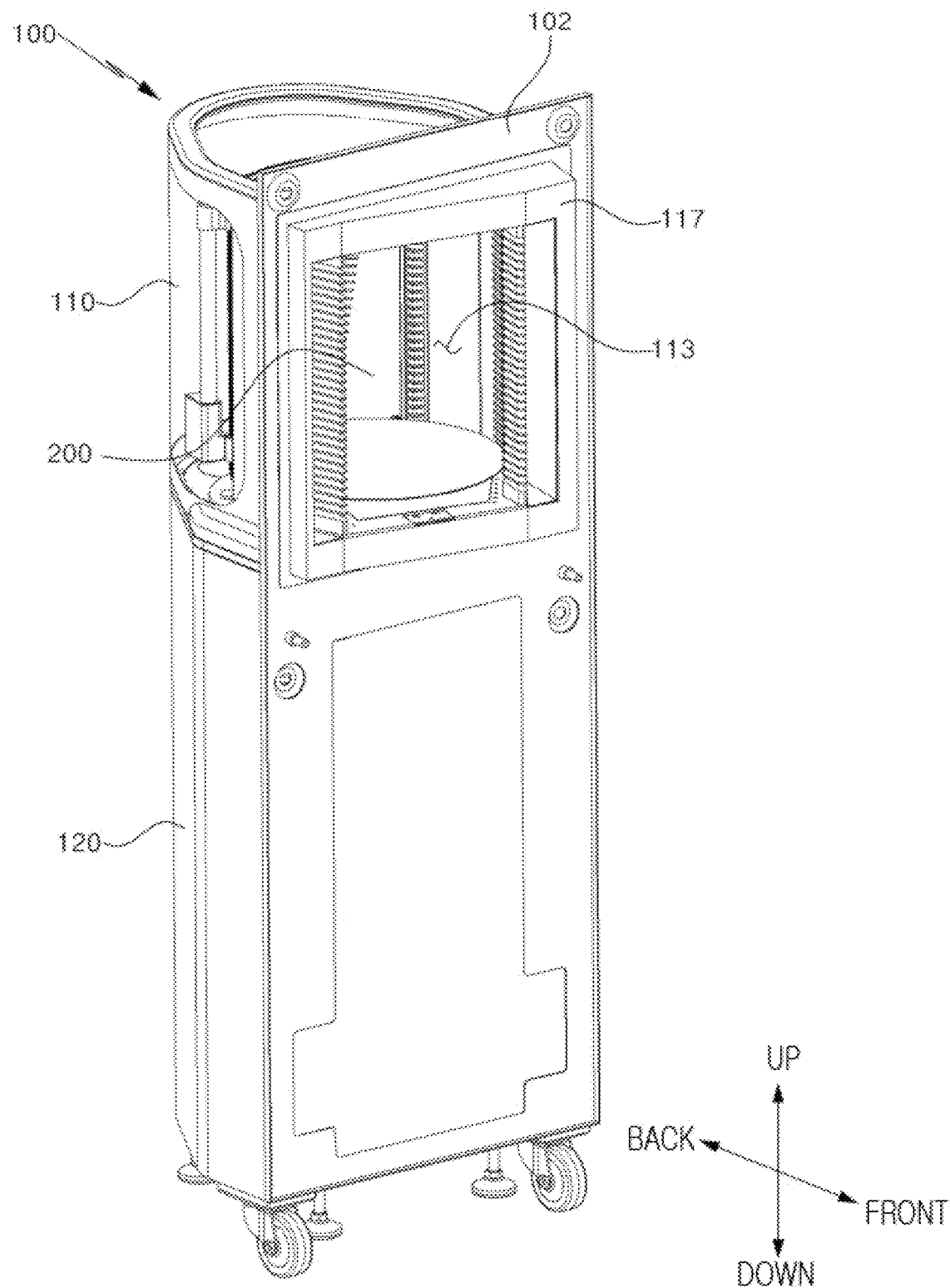
FIG. 1 is a perspective view illustrating an apparatus for removing fume according to an exemplary embodiment of the present invention.

Some of the exemplary embodiments of the present invention will now be described in detail with reference to the illustrative drawings.

In assigning reference numbers to the components in the drawings, it should be noted that whenever possible, the same reference number is used to refer to the same component even though it is shown in the other drawings. In addition, in describing the exemplary embodiment of the present invention, a detailed description of related known configurations or functions incorporated herein will be omitted when it may make the subject matter less clear.

Further, the terms "first", "second", "A", "B", "(a)", "(b)", and the like may be used to describe components in the exemplary embodiments of the present invention. Such terms are only to distinguish one component from another component, therefore the essence, the sequence, the order, or the like of the corresponding component will not be limited by these terms. It will be understood that when an component is referred to as being "connected to", "coupled to", or "accessed to" another component, it can be directly connected, coupled, or accessed to the other component, however, another intervening component may also be connected, coupled, or accessed thereto.

Hereinafter, an apparatus for removing fume according to an exemplary embodiment of the present invention will now be described in detail with reference to the illustrative drawings.

Figure 2:
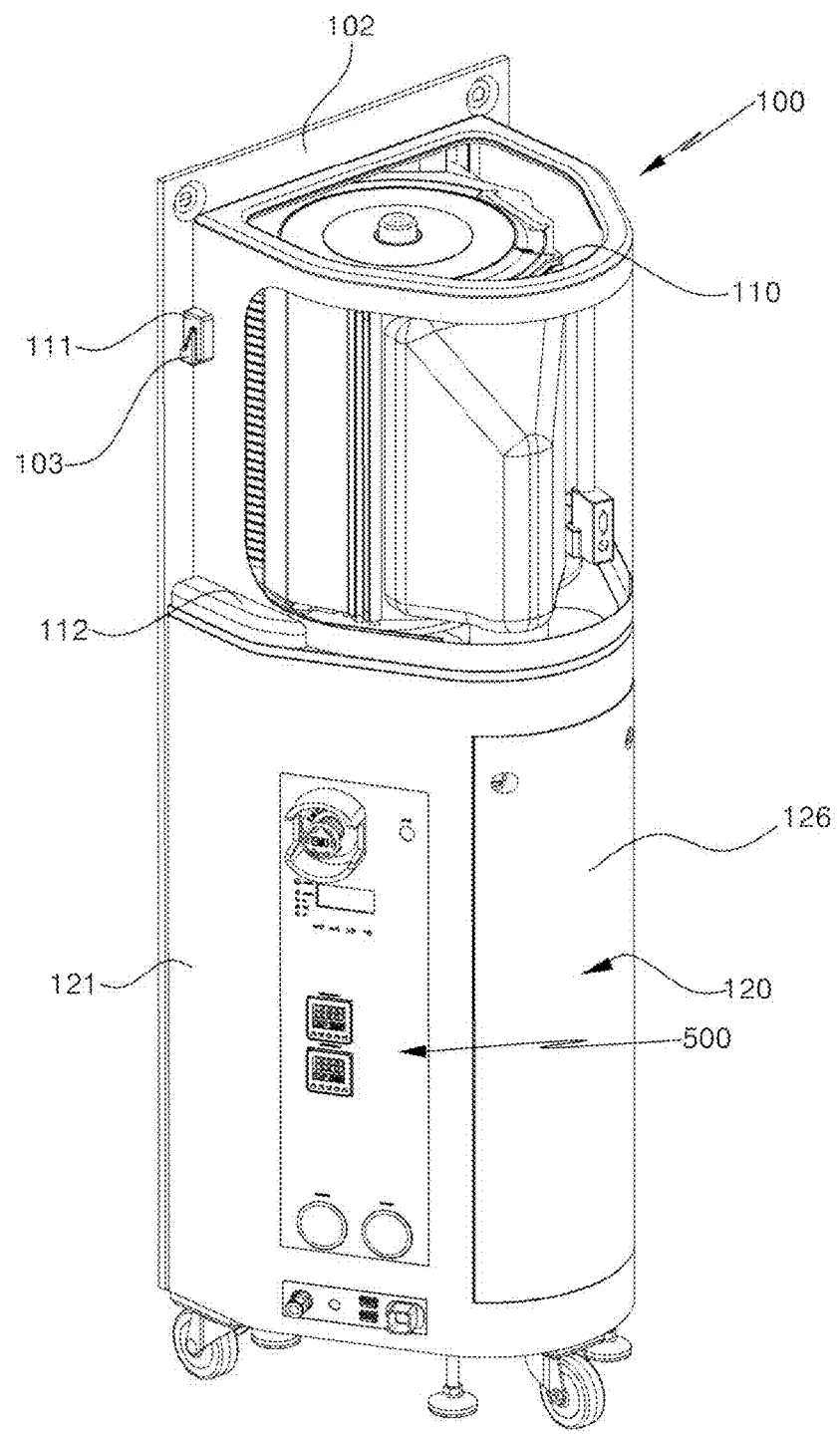
FIG. 2 is a perspective view illustrating an apparatus for removing fume according to an exemplary embodiment of the present invention.
Figure 3:
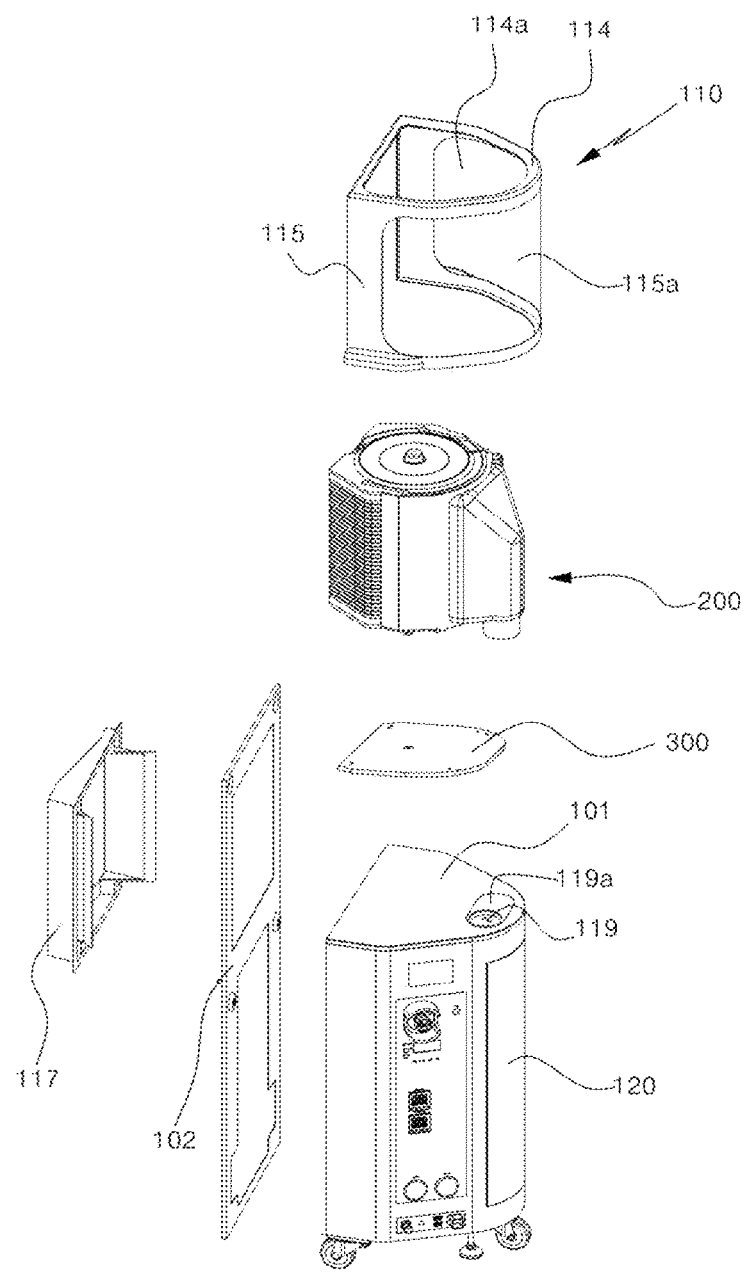
FIG. 3 is an exploded perspective view illustrating an apparatus for removing fume according to an exemplary embodiment of the present invention.

FIGS. 1 and 2 are the perspective views illustrating an apparatus for removing fume according to an exemplary embodiment of the present invention, and FIG. 3 is an exploded perspective view of illustrating an apparatus for removing fume according to an exemplary embodiment of the present invention.

Referring to FIGS. 1 to 3, an apparatus for removing fume according to an exemplary embodiment of the present invention may include a body 100 and a wafer cassette 200.

The body may form the outline of an apparatus for removing fume according to an exemplary embodiment of the present invention. The body 100, for an example, may include a partition 101, a front panel 102, and a first hook 103.

The partition 101 may be a reference in dividing said body 100 into an upper body 110 and a lower body 120. That is, the upper portion with respect to said partition 101 may be named as an upper body 110, and the lower portion with respect to said partition 101 may be named as a lower body 120. The partition 101 may also be named as a lower surface of the upper body 110 or an upper surface of the lower body 120. Said upper body 110 and said lower body 120 will be described later.

In the partition 101, as illustrated in FIG. 4, a height control device 310 of the base plate 300, which will be described later, is supported, and a height control device 320 may be inserted and fixed. That is, the partition 101 can support said base plate 300, and this will be described later.

Figure 10:
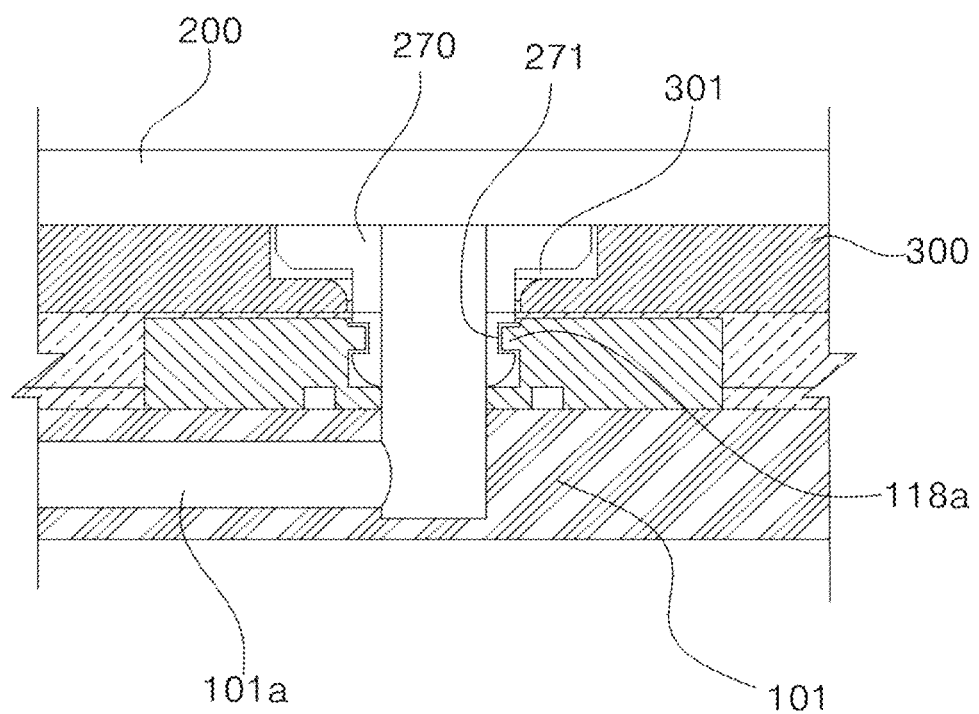
FIG. 10 is a cross-sectional view illustrating the coupled structure of the wafer cassette, the base plate, and the upper body of an apparatus for removing fume according to an exemplary embodiment of the present invention.

In addition, within the partition 101, a gas supply path 101a may be provided as illustrated in FIG. 10. The gas supply path 101a enables a gas which is supplied to wafers in order to remove fume on a wafer (hereinafter referred to as "purge gas") is being supplied to the purge gas tube (not shown) of the wafer cassette 200 through the purge gas connecting port 570 which will be described later. That is, said purge gas connecting port 570 and the purge gas tube of the wafer cassette 200 are communicating with each other via the gas supply path 101a.

The front panel 102, which forms the front surface of the body 100, may be in contact with EFEM (not shown). More specifically, an apparatus for removing fume according to an exemplary embodiment of the present invention may be a side storage provided at one side of EFEM, wherein EFEM means "Equipment Front End Module" which supplies wafers to a process module in a semiconductor production line.

In the front panel 102, a bezel 117 may be protrusively provided towards EFEM that is to be in contact therewith. In addition a first hook 103 may be provided at the backside of the front panel 102.

The first hook 103 and the second hook 111 of the upper body 110, which will be described later, may be coupled together via the hooks. Therefore, it is advantageous in that coupling and removal of the front panel 102 and the upper body 110 may be facilitated through the hook coupling using the first hook 103 and the second hook 113.

In addition, the body 100, for an example, may include an upper body 110 and a lower body 120. Said upper body 110 and said lower body 120 will be described later.

Figure 4A:
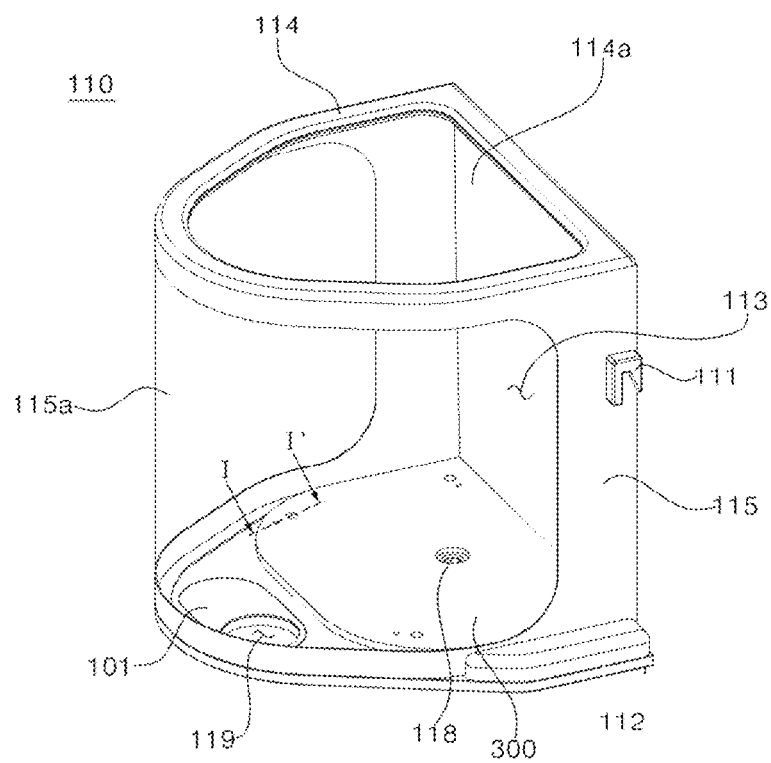
FIG. 4(a) is a perspective view illustrating the structure of the upper body of an apparatus for removing fume according to an exemplary embodiment of the present invention.
Figure 4B:
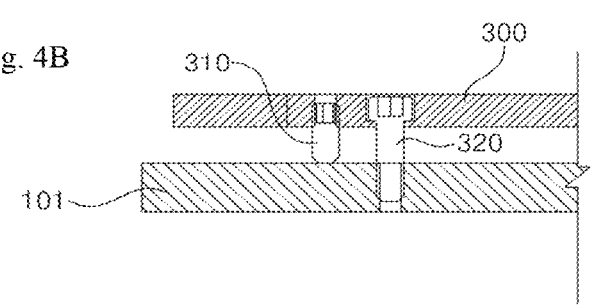
FIG. 4(b) is a cross-sectional view along the line I-I'.
Figure 5:
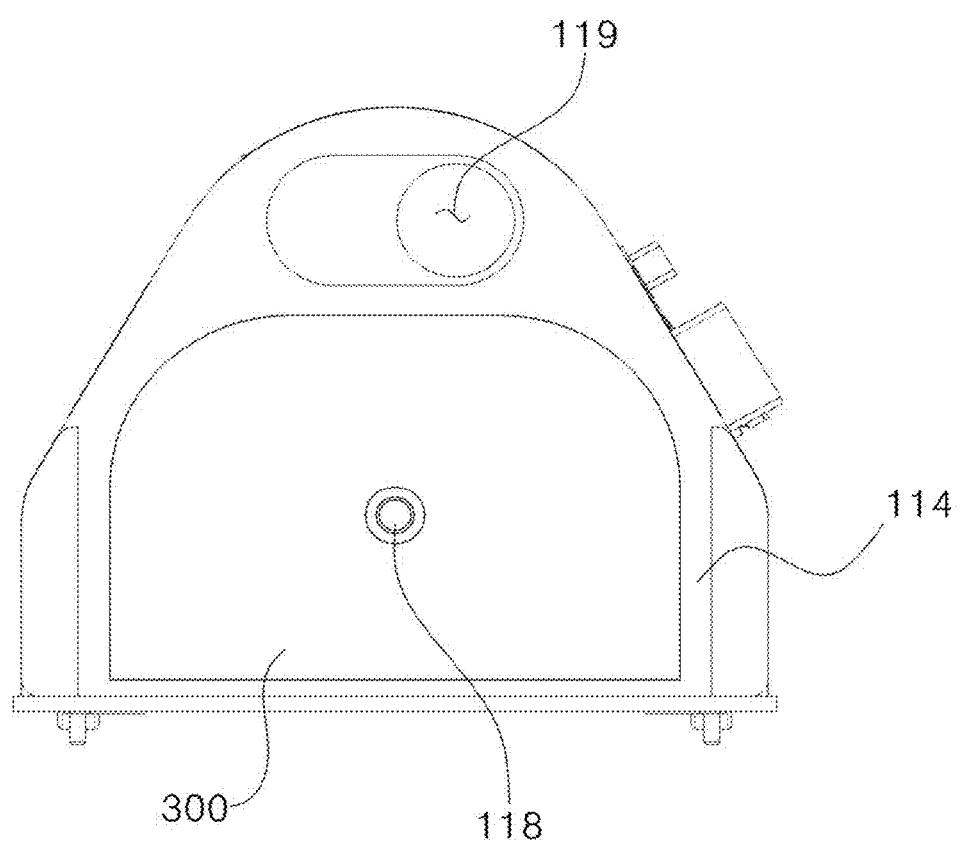
FIG. 5 is a plane view illustrating the structure of the upper body of an apparatus for removing fume according to an exemplary embodiment of the present invention.
Figure 6:
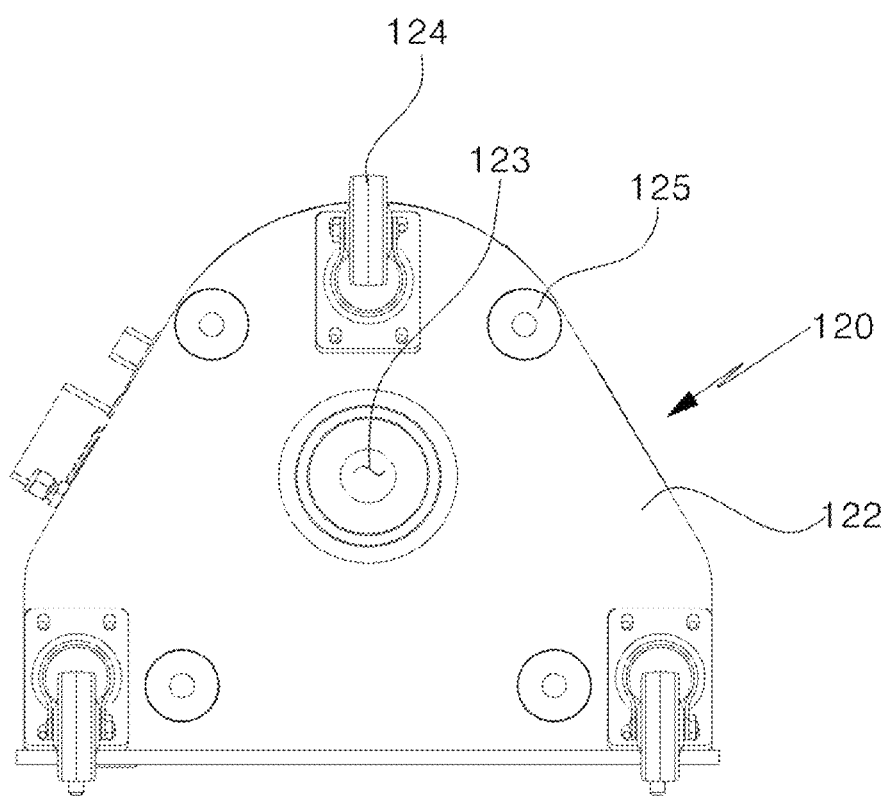
FIG. 6 is a bottom view illustrating an apparatus for removing fume according to an exemplary embodiment of the present invention.

FIG. 4(a) is a perspective view illustrating the structure of the upper body of an apparatus for removing fume according to an exemplary embodiment of the present invention, and FIG. 4(b) is a cross-sectional view along the line I-I'. FIG. 5 is a plane view illustrating the structure of the upper body of an apparatus for removing fume according to an exemplary embodiment of the present invention. FIG. 6 is a bottom view illustrating an apparatus for removing fume according to an exemplary embodiment of the present invention.

Referring to FIGS. 1 to 5, an upper body 110 may include a second hook 111, connecting portion (not shown), a front opening 113, an upper surface 114, a side surface 115, a bezel 117, a purge gas inlet hole 118, and a fume outlet 119.

Since the second hook 111, as mentioned above, provided with a shape corresponding to the first hook 103 of the front panel 102, may be coupled to said first hook 103. The second hook 111, for an example, may be attached in a way that the end of the hook is facing downward direction, while the first hook 103 may be attached in a way that the end the hook is facing upward direction. In this case, it is convenient in that since the upper body 110 can be removed from the front panel 102 just by simply lifting the upper body 110 in upward direction.

The connecting portion couples the upper body 110 with the lower body 120. That is, the detachably coupled upper body 110 can be firmly coupled to the lower body 120 via said connecting portion. Said connecting portion, for an example, may include a configuration for a screw coupling. That is, the upper body 110 can be firmly coupled to the lower body 120 via the screw coupling.

The front opening 113, which is formed at the front of the upper body 110, functions as a path for moving the wafers. That is, either the wafers are supplied to the upper body 110 or the wafers are exported from the upper body 110 via the front opening 113. More specifically, the front opening 113 may communicate with an EFEM, and the wafer handling robot arm (not shown) of the EFEM may supply wafers to the wafer cassette 200, which is located inside of the upper body 110, via said front opening 113. Furthermore, said wafer handling robot arm of said EFEM may export the stacked wafers from the wafer cassette 200, which is located inside of the upper body 110, via said front opening 113.

The upper surface 114 is a term named for the upper side surface of the upper body 110, in an exemplary embodiment of the present invention, said upper surface 114 may include a transparent plate 114a. In this case, it is advantageous in that the user of an apparatus for removing fume according to an exemplary embodiment of the present invention may observe the internal situation of the upper body 110 via said transparent plate 114a.

The side surface 115, which is a term named for the surface comprising side portion of the upper body 110, may include a transparent plate 115a similar to said upper surface. In this case, as written in the description about the upper surface 114, it is advantageous in that the user of an apparatus for removing fume according to an exemplary embodiment of the present invention may observe the internal situation of the upper body 110 through said transparent plate 115a.

A bezel 117 may be protrusively provided on the front panel 102. By utilizing such a structure, a portion of the bezel 117 may be inserted into an EFEM when coupling with the EFEM. Thus, the bezel 117 may be fabricated considering the rotation radius of the wafer handling robot arm of the EFEM.

Furthermore, the bezel 117, as illustrated in FIG. 1, couples the wafer cassette 200 and the upper body 110 at the front; and prevents purge gas, which is purged from the wafer cassette 200, from leaking into the space between the wafer cassette 200 and the upper body 110.

As illustrated in FIG. 10, the purge gas inlet hole 118 may be provided in a corresponding shape of the purge gas inlet coupler 270 such that said purge gas inlet coupler 270 of the wafer cassette 200, which will be described later, can be inserted for coupling. The purge gas inlet hole 118, for an example, may include an inwardly protruded protrusion 118a. In this case, a groove 271 having a corresponding shape of said protrusion 118a is provided in the purge gas inlet coupler 270 such that the upper body 110 and the wafer cassette 200 can be coupled together by inserting said protrusion 118a into said groove 271.

The fume outlet 119 exhausts fumes (residual process gases) occurring from the stacked wafers in the wafer cassette 200. Wafers are processed in a process module under the process gas environment (chamber provided with a process gas), and the residual gases remain on the wafers even after the processes have been completed. But, such process gases remaining on the wafers may damage the wafers or contaminate the process equipments. The fume outlet 119 communicating with the exhaust 400, which will be described later, serves as a path for exhausting the fume which is the residual process gas on said wafers. As an example, the fume remaining on the wafers accommodated inside the wafer cassette 200 flows along the upper hopper 260 of the wafer cassette 200, and flowed into the lower hopper 410 through the fume outlet 119, and exhausted thereafter.

As illustrated in FIG. 4, the fume outlet 119 may be formed in a fume outlet forming portion 119a. Said fume outlet forming portion 119a is movably provided such that the location of the fume outlet 119 can be varied. Through this, when the apparatus for removing fume according to an exemplary embodiment of the present invention is installed to an EFEM, it is advantageous in that said apparatus can be used either at the right side or at the left side of the EFEM by adjusting the location of the fume outlet 119.

Referring to FIGS. 2 and 6, the lower body 120 may include a side surface 121, a bottom surface 122, a fume outlet 123, a caster 124, a leveler 125 and a door 126.

In the side surface 121, as illustrated in FIG. 2, an interface unit 500 may be included, this will be described later.

In the bottom surface 122, a fume outlet 123, a caster 124, and a leveler 125 may be provided which will be described later.

The fume outlet 123 communicating with the connecting port 450 of the exhaust 400, which will be described later, may serve as a path for exhausting the fume exhausted through said exhaust 400. The fume outlet 123, for an example, may be formed in a circular shape in the central area of the bottom surface 122 of said lower body 120, but it is not limited to this.

The casters 124 are installed in the bottom surface 122 of the lower body 120, and provide convenience in moving the apparatus for removing fume according to an exemplary embodiment of the present invention. More specifically, the casters 124 are provided with wheels for facilitating the movement of said apparatus for removing through the rotation of said casters 124.

The levelers 125 are provided in the bottom surface 122 of the lower body 120, and increase the fixation strength of the apparatus for removing fume according to an exemplary embodiment of the present invention. More specifically, the levelers 125 can be moved vertically by rotation thereof, and may be protruded further than said casters 124 from the bottom surface 122 of said lower body 120. When the levelers 125 are protruded further than said casters 124 from the bottom surface 122 of said lower body 120, the casters 124 are being floated in the air. Therefore, the users may not easily move said apparatus for removing fume. Of course, when both the casters 124 and the levelers 125 are in contact with the floor, the movement of said apparatus for removing fume may also be limited. Furthermore, the levelers 125 may be use for adjusting the height of the apparatus for removing fume when it is installed to an EFEM.

When moving said apparatus for removing fume, a user may move upward the levelers 125 and let the casters 124 touch the ground floor where said apparatus for removing fume is installed. In this state, a user may move said apparatus for removing fume with a force which simply pushing said apparatus for removing fume. When said apparatus for removing fume is installed in the EFEM, the levelers 125 may be moved down to touch the ground by rotating the levelers 125, so that said apparatus for removing fume is firmly installed without any movement.

The door 126 may be installed at the side surface 121 of the lower body 120 in a way that it can be opened and shut selectively. That is, a user can easily access the inside of the lower body 120 by opening and shutting the door 126.

A wafer cassette 200 stacked with wafers is accommodated inside said upper body 110. Also, it may be explained that said wafer cassette 200 is supported by the lower body 120. Said wafer cassette 200 will be discussed in detail hereinafter.

Figure 7:
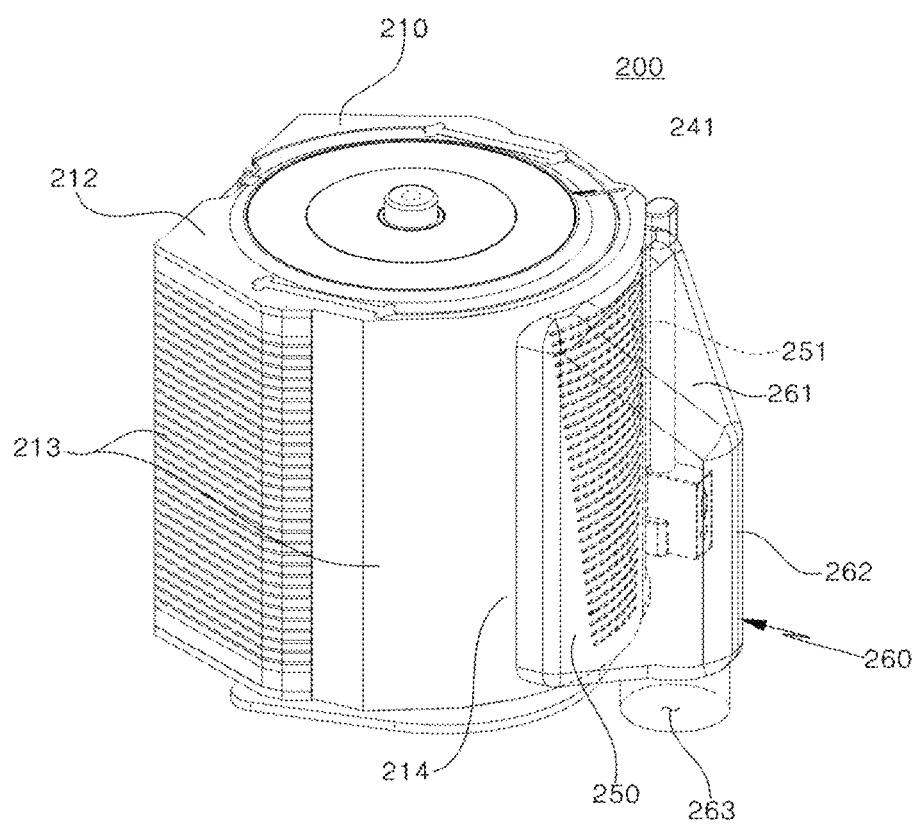
FIG. 7 is a perspective view illustrating a wafer cassette of an apparatus for removing fume according to an exemplary embodiment of the present invention.
Figure 8:
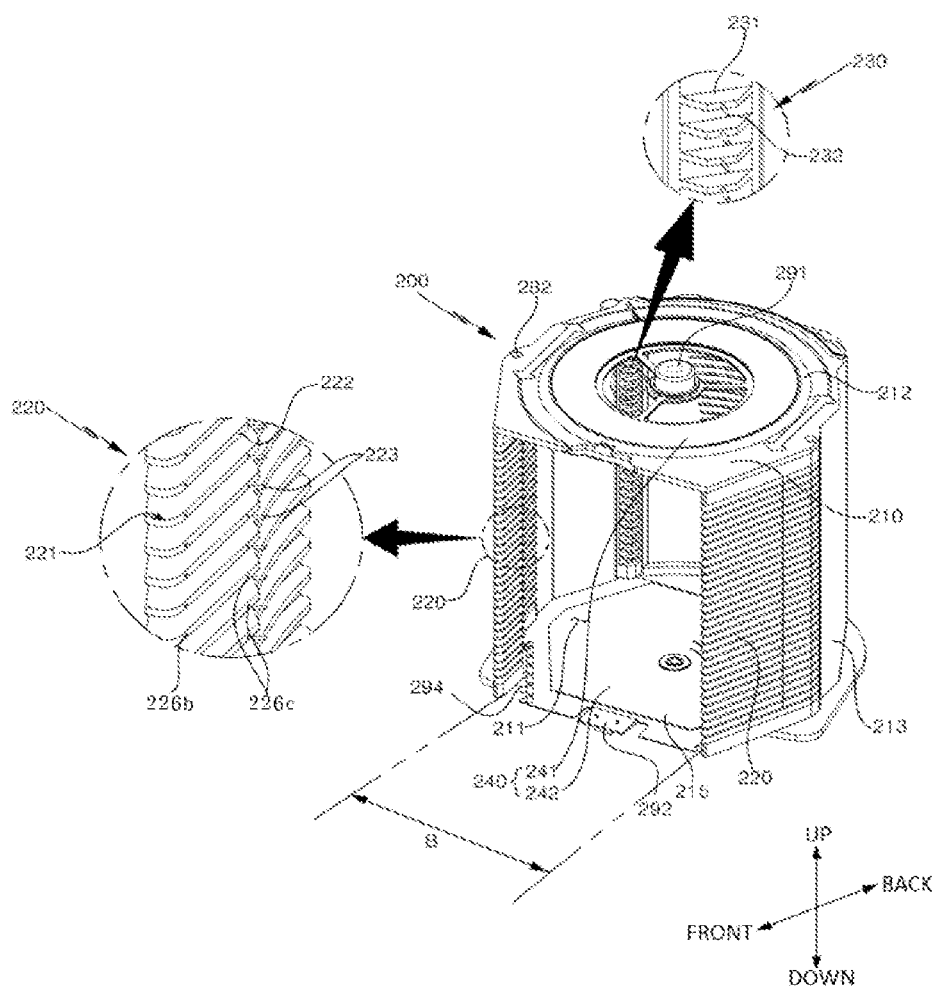
FIG. 8 is a perspective view and an exploded perspective view illustrating a wafer cassette of an apparatus for removing fume according to an exemplary embodiment of the present invention.
Figure 9:
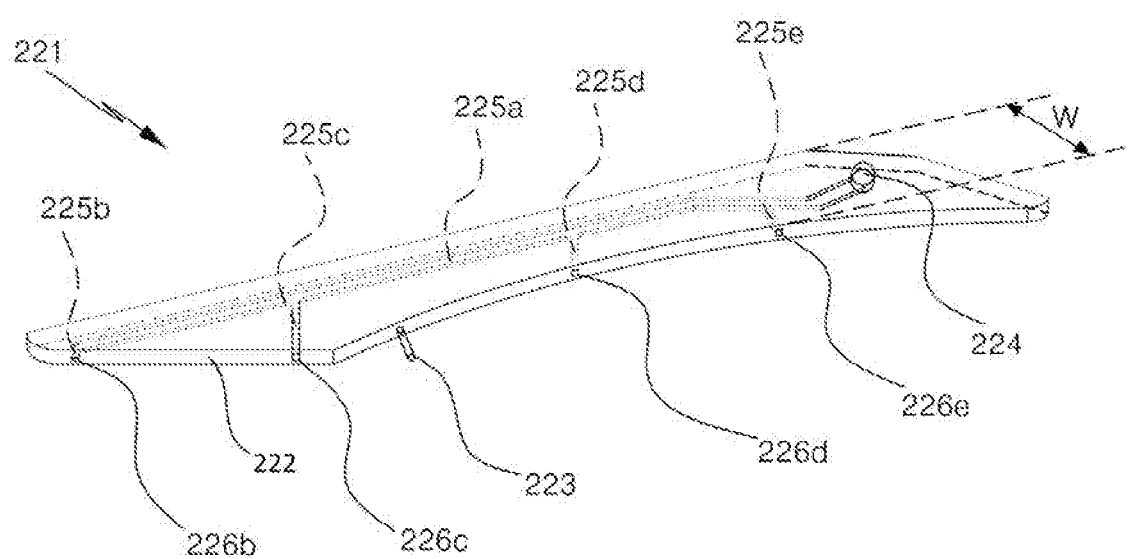
FIG. 9 is a perspective view illustrating a stacking shelf in a first wafer support of an apparatus for removing fume according to an exemplary embodiment of the present invention.

FIG. 7 is a perspective view illustrating a wafer cassette of an apparatus for removing fume according to an exemplary embodiment of the present invention. FIG. 8 is a perspective view and an exploded perspective view illustrating a wafer cassette of an apparatus for removing fume according to an exemplary embodiment of the present invention. FIG. 9 is a perspective view illustrating a stacking shelf in a first wafer support of an apparatus for removing fume according to an exemplary embodiment of the present invention.

Referring to FIGS. 7 to 9, a wafer cassette 200 of an apparatus for removing fume according to an exemplary embodiment of the present invention may include: a case 210, a first wafer support 220, a second wafer support 230, a heating member 240, a punching plate 250, an upper hopper 260, a purge gas inlet coupler 270, a purge gas tube (not shown), a leveler 291, a first sensor 292, a second sensor (not shown), and an illumination unit 294.

The case 210 may form an exterior of the wafer cassette 200. The case 210 may be provided in a larger size than the wafers in order to accommodate the wafers inside thereof. As illustrated in FIGS. 7 and 8, the case 210 may be formed to be airtight except the area corresponding to the front opening 113 of the upper body 110. In this case, the purge gas ejecting from the purge gas outlet 226 of the first wafer support 220 may be circulated only inside of the case 210 and exhausted thereafter. That is, when the case 210 is not provided, the purge gas exhausted onto the wafers is circulated all over the entire interior of the upper body 110, therefore the amount of the purge gas used for removing the fume is increased compare with the situation wherein a case 210 is provided. In other words, the airtight structure of the case 210 may save the amount of the purge gas used for removing the fume on the wafers. Also, it may be explained that the airtight structure of the case 210 enhances the fume removing efficiency of the wafers.

The case 210 may be provided with a front opening 211 formed to have a corresponding size in a corresponding location to the front opening 113 of the upper body 110. The front opening 211 of the case 210 may be functioned as an incoming and outgoing path for the wafers. Furthermore, said case 210 may have an airtight structure except the front opening 211 as discussed before.

The case 210 may be provided with an upper heater 241, a leveler 291 and the like on the upper surface 212. The upper heater 241 and the leveler 291 will be described later.

In addition, the case 210 may include a first wafer support 220, a second wafer support 230, a side gas tube 282, and a rod heater (not shown) in the side surface 213. Said the first wafer support 220, the second wafer support 230, the side gas tube 282, and the rod heater will be described later.

In addition, the case 210 may be provided with a punching plate 250, and an upper hopper 260, and the like on the back surface 214 thereof. Said punching plate 250 and said upper hopper 260 will be described later.

Furthermore, the case 210 may be provided with a lower heater 242, a purge gas inlet coupler 270, a lower gas tube (not shown), a first sensor 292, a second sensor (not shown), an illumination unit 294, and the like in the back surface 215 thereof. Said lower heater 242, the purge gas inlet coupler 270, the lower gas tube, the first sensor 292, the second senor, and the illumination unit 294 will be described later.

The first wafer support 220 supports the wafers and supplies purge gas to said wafers. The first wafer support 220, as illustrated in FIG. 8, may be provided on both sides of the side surfaces 213 of the case 210 respectively. In addition, the first wafer support 220 may include many individual stacking shelves 221 which are vertically separated from each other, wherein each individual stacking self can carry one wafer. Wafers can be accessed through the spaces between the multiple stacking shelves 221. In other words, the wafer handling robot arm of the EFEM can access wafers through the spaces between the multiple stacking shelves 221. Using this kind of structure, the first wafer support 220 may support a number of wafers as being stacked and separated from each other Said individual stacking shelf 221, for an example, may include an inclined ramp portion 222. The inclined ramp portion 222, which is a portion of said stacking shelf 221 as illustrated in FIGS. 8 and 9, is protrusively formed facing towards the round wafer which is stacked in said stacking shelf 221, and has an inclined ramp. The inclined ramp portion 222 may be provided with a second purge gas outlet 226c which will be described later. Said second purge gas outlet 226c supplies purge gas towards the front of the round wafer (i.e. towards the front opening 211 shown in FIG. 8) which is stacked in said stacking shelf 221, and enables the purge gas to be supplied to the entire wafer. That is, the inclined ramp portion 222 in the stacking shelf 221 and the second purge gas outlet 226c provided in said inclined ramp portion 222 perform roles in preventing any dead zone where no purge gas is supplied on the wafer which is stacked in the stacking shelf 221.

Further, the stacking shelf 221 may be provided with a pin 223 for supporting the wafer. In the stacking shelf 221, for an example, many pins 223 may be provided for supporting the wafer. Said pin 223, for an example, may be a shape of a thin rod as illustrated in FIG. 8. When the wafer is supported by said pin 223, it is advantageous in that since the contact area between the wafer and other parts for supporting the wafer is minimized, the wafer damage caused by contact can be minimized.

The stacking shelf 221 may have a predetermined width (refer to 'W' in FIG. 9). In this case, the vertical flow of the purge gas, which is supplied to the wafer stacked on said pin 223, is limited due to the blocking of the stacking shelf 221 and the wafer, therefore, the purge gas flows only to the horizontal direction. That is, when the stacking shelf 221 has a width to fill the space between the wafer and the case 210, it is advantageous in that since the vertical movement of the purge gas is limited by the stacking shelf 221 and the wafer, the amount of the purge gas used in purging the wafer is reduced. It may be explained that this advantage and the foregoing airtight structure of the case 210 would enhance the efficiency in removing the fume on the wafer.

The stacking shelf 221 may include a purge gas inlet 224 which accommodate the side gas tube 282 for supplying the purge gas. That is, a purge gas may be flown into the stacking shelf 221 via said purge gas inlet 224.

In addition, a purge gas flow path 225 and a purge gas outlet 226 may be provided in the stacking shelf 221. The purge gas flow path 225 is a flow path wherein a purge gas, which has been supplied via said purge gas inlet 224, flows for being exhausted via said purge gas outlet 226. That is, the purge gas outlet 226 is a path wherein a purge gas which has flown into via the purge gas inlet 224 is passing through the purge gas flow path 225 and being exhausted. The purge gas which has been exhausted via the purge gas outlet 226 is supplied to the wafers stacked on the stacking shelf 221.

Said purge gas flow path 225 may include multiple branch flow paths 225b, 225c, 225d, 225e which are branching from the main flow path 225a. Said purge gas flow path 225, for an example, may include a main flow path 225a, a first branch flow path 225b, a second branch flow path 225c, a third branch flow path 225d, and a fourth branch flow path 225e. Said branch flow paths from the first branch flow path 225b to the fourth branch flow path 225e may be named in sequence from the front (direction from where the wafers are supplied) to the rear. Said branch flow paths from the first branch flow path 225b to the fourth branch flow path 225e may be provided to have an obtuse angle with the main flow path 225a. Further, among the branch flow paths from the first branch flow path 225b to the fourth branch flow path 225e, the branch flow path for ejecting relatively less purge gas than the others may be arranged to have a right angle or an acute angle with the main flow path 225a. The diameters of the first branch flow path 225b, the second branch flow path 225c, the third branch flow path 225d, and the fourth branch flow path 225e may be different from each other. In here, the diameter should be understood as a concept which includes indexes such as area, width and the like for representing the size of a polygon. For an example, the diameters of the first branch flow path 225b, the second branch flow path 225c, the third branch flow path 225d, and the fourth branch flow path 225e may be getting smaller orderly from the first branch flow path 225b to the fourth branch flow path 225e. Besides, the diameters of the first branch flow path 225b, the second branch flow path 225c, the third branch flow path 225d, and the fourth branch flow path 225e may have sizes corresponding to the first purge gas outlet 226b, the second purge gas outlet 226c, the third purge gas outlet 226d, and the fourth purge gas outlet 226e, which will be described later. Thus, the diameters may be getting smaller orderly from the first purge gas outlet 226b to the fourth purge gas outlet 226e. In this case, relatively more purge gas is ejected from the purge gas outlet 226b which ejects purge gas towards the front of the wafer. At this time, since the purge gas exhausted to the wafer flows from the front (at the front opening 211) towards the rear direction (towards the punching plate 250), a larger amount of purge gas flows from the front to the rear of the wafer.

In addition, the stacking shelf 221 may include a fixing device (not shown). In said fixing device a supporting member (not shown) having a rod shape may be inserted for supporting a number of stacking shelves 221. That is, a number of stacking shelves 221 can be supported as being separated from each other through said supporting member.

Further, the stacking shelves 221 of the first wafer support 220 may be provided at both sides inside the case 210 of the wafer cassette 200. At this time, the width between said stacking shelves 221 (B in FIG. 8), which are provided at both sides, may have smaller than the diameter of the wafer. Such a structure, as mentioned above, is advantageous in supplying the purge gas from the front of the wafer. On the other hand, loading the wafers into said stacking shelves 221 may be problematic; however, the problem in loading and unloading the wafers may be avoided by providing a gap between the stacking shelves 221 according to the present invention.

The second wafer support 230 supports the wafers. In addition, it may be explained that the second wafer support 230 assists the first wafer support 220 supports in supporting the wafers. The second wafer support 230 may be provided in each side surface 213 of the case 210 as illustrated in FIG. 8. Besides, the second wafer support 230 may be provided at relatively rear location with respect to the location of the first wafer support 220. The second wafer support 230 may include a stacking shelf 231 and a pin 232 protrusively provided from said stacking shelf 231. Said pin 232 supports the wafer at the bottom thereof. The pin 232 of said second wafer support 230 may be provided to have a thin rod shape same as the shape of the pin 223 of the first wafer support 220. By using these (pins), the contact area with the wafer can be minimized.

The heating member 240 heats the inside of the wafer cassette 200. The heating member 240, for an example, may include an upper heater 241, a lower heater 242, and a rod heater (not shown). The upper heater 241 may be provided on the upper surface 212 of the case 210. Meanwhile, the lower heater 242 may be provided on the bottom surface 215 of the case 210. Said rod heater may be plurally provided on the side surface 213 of the case. The heating members 240, as reviewed before, are provided evenly on the upper surface 212, the side surface 213, and the bottom surface 215, thereby uniformly heating the inside of the wafer cassette 200.

The punching plate 250, for an example, may be provided on the back surface 214 of the case 210. Besides, the punching plate 250 may include many air suction holes 251. Said air suction holes 251 are the paths for exhausting the fume and the purge gas generated from the wafers accommodated inside the wafer cassette 200. The shape of said air suction holes 251, for an example, may be arranged in straight lines as illustrated in FIG. 7, but it is not limited to this. That is, the air suction holes 251 may be arranged in various shapes including a circular shape, a polygon shape, and the like as long as it can be served as a path for exhausting the fume and the purge gas. But, preferably, said air suction holes 251 may be provided in an array of lines whose line widths are getting wider as it goes upward direction (refer to FIG. 7). In this case, it is advantageous in that the fume and the purge gas inside of the wafer cassette 200 can be uniformly exhausted from the top and the bottom (of the wafer cassette). This is because that the fume and the purge gas are passing through the upper hopper 260, which is provided in the back surface of the punching plate 250, and exhausted via the fume outlet 119 which is provided in the partition 101 corresponding to the bottom surface of the upper body 110, a faster flow speed is formed in the lower portion of the wafer cassette 200, which is located relatively nearer to the fume outlet 119, than in the upper portion due to such flow path of the fume and the purge gas.

The upper hopper 260 performs a function for guiding the fume and the purge gas which are exhausted via the air suction holes 251 of the punching plate 250 to the fume outlet 119 of the upper body 110. The upper hopper 260, for an example as illustrated in FIG. 7, may include an inclined ramp portion 261, a streamlined portion 262, and an exhausting flow path 263. The inclined ramp portion 261, which is located at the top of the upper hopper 260, performs a function for guiding the fume and the purge gas which are exhausted via the air suction holes 251 to the fume outlet 119 which is located in lower portion. The streamlined portion 262, which is located at the lower portion of said streamlined portion 261, performs a function for guiding the fume and the purge gas to the fume outlet 119. The streamlined portion 262 may have a streamlined structure to avoid any dead zone wherein the fume and the purge gas are being stagnated. The exhausting flow path 263 is provided in the lower portion of said streamlined portion 262, and inserted into said fume outlet 119. The fume and the purge gas, which are exhausted via the fume outlet 119, is flown into the lower hopper 410 of the exhaust 400 which will be described later.

The purge gas inlet coupler 270 may be inserted into the center hole 301 of the base plate 300 and the purge gas inlet hole 118 of the upper body 110 as illustrated in FIG. 10. The purge gas inlet coupler 270 is coupled with said center hole 301 and the purge gas inlet hole 118. When coupled in this way, it is ready to receive the purge gas which is supplied from the gas supply path (refer to 101a in FIG. 10). The purge gas supplied from said gas supply path 101a may be exhausted to the surface of the wafer via the purge gas outlet 226 of the stacking shelf 221 through the purge gas tube (not shown) which will be described later. The purge gas inlet coupler 270, for an example, may include a groove 271. Said groove 271 may be provided to have a corresponding shape to the protrusion 118a of the upper body 110. In this case, when said purge gas inlet coupler 270 is inserted into the purge gas inlet hole 118, said protrusion 118a is being inserted into said groove 271, thereby forming a rigid coupling force. Furthermore, since the coupling strength between the purge gas inlet hole 118 and the purge gas inlet coupler 270 is enhanced via such a structure, there is an effect of preventing the leakage of the purge gas.

The purge gas tube (not shown) is connected with said purge gas inlet coupler 270 and performs a function for supplying the purge gas, which is being supplied, towards the purge gas inlet 224 of the first wafer support 220. The purge gas tube, for an example, may include the lower gas tube (not shown) and the side gas tube 282. The lower gas tube may be arranged along the lower surface 215 of the case 210. The lower gas tube may connect the purge gas inlet coupler 270 and the side gas tube 282. That is, the lower gas tube may supply the purge gas which is supplied via the purge gas inlet coupler to the side gas tube 282. The side gas tube 282 is coupled to the purge gas inlet 224 as illustrated in FIG. 8, and may supply the purge gas to the purge gas flow path 225.

The leveler 291 detects whether the wafer cassette 200 is leveled for proper horizontal position. The leveler 291, for an example, may be a digital leveler. In this case, it is advantageous in that the measured values detected by the leveler 291 about the horizontal level of the wafer cassette 200 can be displayed on the display unit 520 of the interface unit 500 which will be described later. In addition, on the interface unit 500 a separated gauge (not shown) may be provided for displaying the values measured by said digital leveler. In addition, a alarm output unit (not shown) may be provided for outputting a warning message or an alarm sound when the value measured by said leveler 291 exceeds the reference value, in other words, when the wafer cassette 200 is not installed with a proper horizontal level (in right position). Said alarm output unit may be controlled by the controller (not shown) which will be described later. Horizontal level adjustment of the wafer cassette 200 is accomplished by the base plate 300, and this will be described later.

The first sensor 292 detects whether the wafers are existing inside of the wafer cassette 200, or not. The first senor 292, for an example, may be provided at the lower surface 215 of the case 210 as illustrated in FIG. 8, but it is not limited to this. The first senor 292 may be connected to the control unit, and said control unit may stop the exhausting of the purge gas if said first sensor 292 determines that no wafers exists inside the wafer cassette 200.

The second senor (not shown) detects whether the wafers, which are stacked in the pins 223 and 232 of the stacking shelves 221 and 231 respectively in the wafer cassette 200, are frontwardly protruded, that is, whether the wafers are stacked in correct positions thereof. The second senor may be provided in the bottom surface 215 of the case 210, but it is not limited to this. The second senor may be connected to the control unit, and said control unit may output a warning message of an alarm sound via the alarm output unit if the wafers are not stacked in correct positions by said second sensor, and may control the wafer handling arm of the EFEM for stacking the wafers in correct positions.

The illumination unit 294 illuminates inside of the wafer cassette 200. For an example, said upper body 110 may include transparent plates 114a and 115a, and the case 210 of the wafer cassette 200 may also be fabricated with a transparent material. In this case, it is advantageous in that when the inside of the wafer cassette 200 is illuminated by the illumination unit 294, a user may observe from the outside whether the process inside of the wafer cassette 200 is appropriately progressing or not. The illumination unit 294 may be an LED, but it is not limited to this.

FIG. 10 is a cross-sectional view illustrating the coupled structure of the wafer cassette, the base plate, and the upper body of an apparatus for removing fume according to an exemplary embodiment of the present invention.

Referring to FIG. 4 and FIG. 10, an apparatus for removing fume according to an exemplary embodiment of the present invention may further include a base plate 300.

The base plate 300 is provide between the wafer cassette 200 and the partition 101 of the body 100, and may adjust the horizontal level and the vertical height of said wafer cassette 200. That is, the base plate 300 may include a structure for adjusting the horizontal level. The base plate 300, for an example, may include a center hole 310, a height control device 310, and a height fixing device 320. A purge gas inlet coupler 270 of the wafer cassette 200 may be inserted into the center hole 301 of the base plate 300. In addition, the height control device 310 of the base plate 300 may adjust the distance between the base plate 300 and the partition 101 through the vertical movement by rotating thereof, as illustrated in FIG. 4. The height control device 310 of the base plate 300 may fix the base plate 300 to the body 100 by penetrating the base plate and inserting at least a portion thereof into the partition 101, as shown in FIG. 4. Said height fixing device 320, for an example, is provided with threads so as to be thread-coupled to the body 100, but it is not limited to this.

Of course, a structure for adjusting the horizontal level and the vertical height may be provided in the wafer cassette 200 directly. However, when the horizontal level and the vertical height adjustment devices for the wafer cassette 200 are applied to the base plate 300 as an exemplary embodiment of the present invention, it is advantageous in that the horizontal level may not be adjusted for every wafer cassette 200 even when a number of wafer cassettes 200 are mixedly used.

Figure 11:
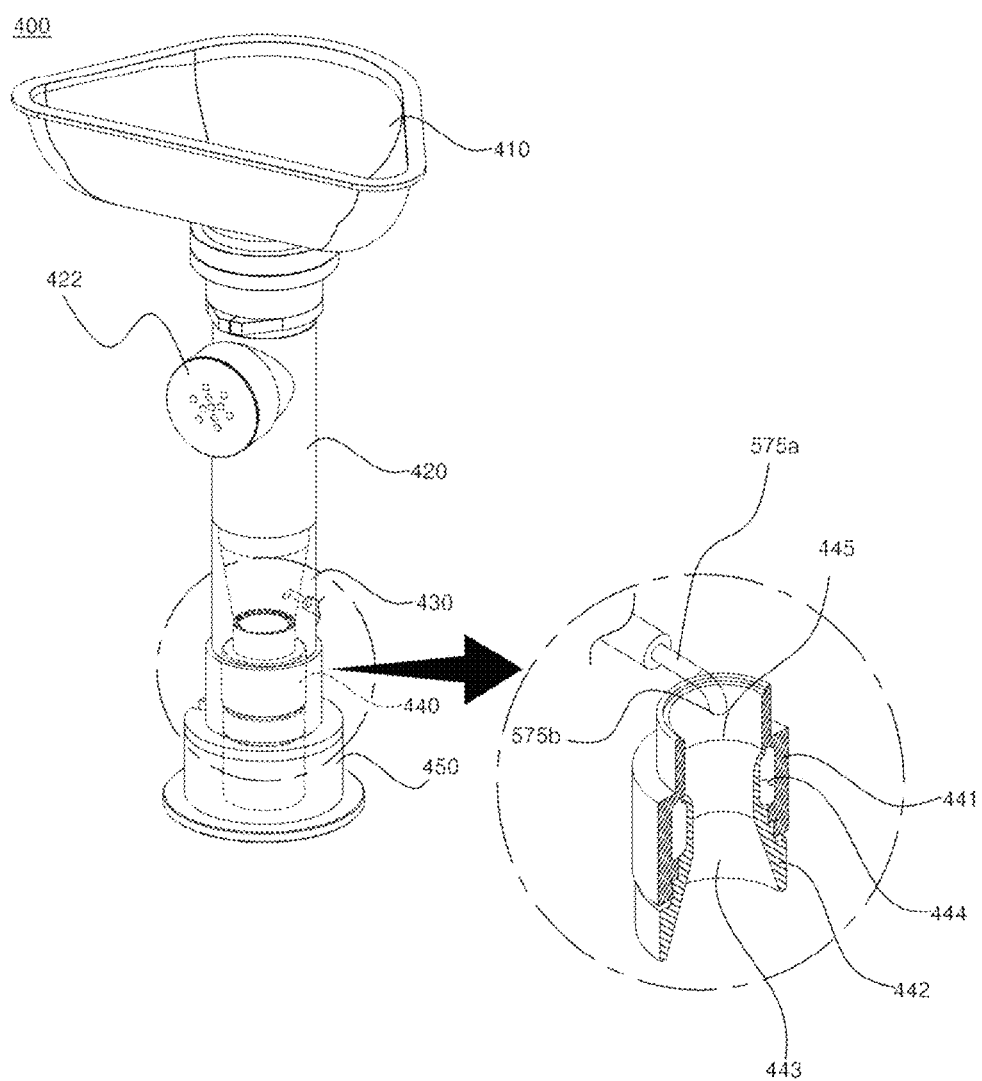
FIG. 11 is a perspective view illustrating an exhaust of an apparatus for removing fume according to an exemplary embodiment of the present invention.

FIG. 11 is a perspective view illustrating an exhaust of an apparatus for removing fume according to an exemplary embodiment of the present invention.

Referring to FIG. 11, an apparatus for removing fume according to an exemplary embodiment of the present invention may further include an exhaust 400.

The exhaust 400 may intake the fume generated from the wafers stacked inside of the wafer cassette 200 and the purge gas ejected from the wafer cassette 200, and exhaust to the outside. The exhaust 400 may include a lower hopper 410, a first exhausting pipe 420, a second exhausting pipe 430, an exhausting pump 440, and a connecting port 450.

The lower hopper 410 may be provided below the bottom surface of the upper body 110 or below the partition 101. That is, the lower hopper 410 may be provided inside of the lower body 120. The lower hopper 410 communicating with the fume outlet 119 of the upper body 110 guides the flow of the fume and the purge gas which are exhausted via said fume outlet 119. The lower hopper 410 may guide the fume and the purge gas which are exhausted via said fume outlet 119 to the first exhausting pipe 420. The lower hopper 410 forms a double hopper structure with the upper hopper 260 located in the upper body 110. According to an exemplary embodiment of the present invention, the back flow of the fume and the exhausting gas can be minimized through this double hopper structure. Furthermore, since the lower hopper 410 has a streamline structure with an opened top, the dead zone where the fume and the purge gas are stagnated can be minimized.

The first exhausting pipe 420 may connect the lower hopper 410 and the second exhausting pipe 430. That is, the fume and the exhausting gas flowed into the first exhausting pipe 420 through the lower hopper 410 may be flowed to the second exhausting pipe 430. The first exhausting pipe 420, for an example, may include a connecting pipe (not shown) and a connecting end 422. Said connecting pipe may couple said lower hopper 410 and the first exhausting pipe 420. Thus, said connecting pipe may include a sealing member for preventing the leakage of the fume and the exhausting gas at the connecting end area. In addition, the connecting end 422 may be formed at the side of the first exhausting pipe 420, and connected to a separate pipe (not shown). For an example, said connecting end 422 may communicate with a tube (not shown) which is connecting with the inside of the EFEM. In this case, it is advantageous in that the internal fluid such as a fume and the like of the EFEM can be removed by installing a relatively simple tubing structure. Said connecting end 422 may be provided with a switching member such as a damper, and can be controlled such that it is opened only when used.

The second exhausting pipe 430 connects the first exhausting pipe 420 and the connecting port 450. For an example, an exhausting pump 440 may be provided inside the second exhausting pipe 430.

The exhausting pump 440 may control the flow direction and the speed of the fluid on the flow path connecting the upper hopper 260, the lower hopper 410, the first exhausting pipe 420, and the second exhausting pipe 430. That is, the fume and the purge gas inside of the wafer cassette 200 can be exhausted by the exhausting pump 440, and the amount of exhaust gas per unit time of said fume and the purge gas may be increased or decreased.

The exhausting pump 440, for an example, may be provided as a member for controlling the speed of the fluid by supplying compressed air through a compressor (not shown) without using a motor, hereinafter this member may be referred to as a compressed air exhauster. But, it should be noted that the compressed air supplied by the compressed air exhauster may be replaced by the other fluids. In this case, it is advantageous in that the vibration transferred to the apparatus for removing fume is minimized when compared with the case using a motor. Furthermore, although continuous replacements are required for the case using a motor, it is advantageous in that such problem can also be solved when using said compressed air exhauster. The structure of said compressed air exhauster is illustrated in detail with a cross-sectional drawing thereof FIG. 11.

Referring to FIG. 11, said compressed air exhauster may include a first body 441, a second body 442, an expanded portion 443, a compressed air transition area 444 and a compressed air outlet 445.

The first body 441 and the second body 442 are hollowed pipes as illustrated in FIG. 11, and at least a portion thereof may be provided to have corresponding shapes for mutual coupling. When the first body 441 and the second body 442 are coupled, a compressed air transition area 444 and a compressed air outlet 445 may be provided between them. The compressed air transition area 444 is a space wherein the compressed air injected from the external compressor can be flowed, and the compressed air outlet 445 may be a flow path wherein the compressed air having flowed through said compressed air transition area 444 is flowing into the inside of the first body 441 and the second body 442. In other words, the compressed air being supplied by said compressed air exhauster flows through the compressed air transition area 444, which is a space between the first body 441 and the second body 442, and flows into the inside of the first body 441 and the second body 442 through the compressed air outlet 445. At this time, the compressed air is exhausted along the compressed air outlet 445 after filling the entire compressed air transition area 444, thus, it is advantageous in that the exhausting compressed air can be uniformly exhausted without leaning to one side. Said compressed air outlet 445 may be fabricated in various sizes. Furthermore, said compressed air outlet 445 may be provided have a variable structure. Such variable structure of the compressed air outlet 445, for an example, may be accomplished by installing the first body 441 and the second body 442 in a way that the relative movement is possible therebetween. In this case, since the amount of the compressed air exhausted through the compressed air outlet 445 is varied, the speed of the exhausting gas exhausted by the compressed air exhauster can be changed.

The second body 442 may include an expanded portion 443 whose diameter is getting wider as it travels downward. In this case, the compressed air, which has flowed into the inside of the first body 441 and the second body 442, will flow towards the wider diameter direction of the expanded portion 443. This is because the gas in the higher pressure region is tend to flow towards the lower pressure region since the gas pressure in the wider diameter area is relatively lower than the smaller diameter area. That is, the expanded portion 443 may determine the direction of the compressed air flowing into the inside of the first body 441 and the second body 442. Thus, when a flow of the compressed air inside of the compressed air exhauster occurs, it has an effect on the exhausting direction and the speed of the fume and the purge gas inside of the wafer cassette 200 communicating via the lower hopper 410 and the first exhausting pipe 430.

Figure 13:
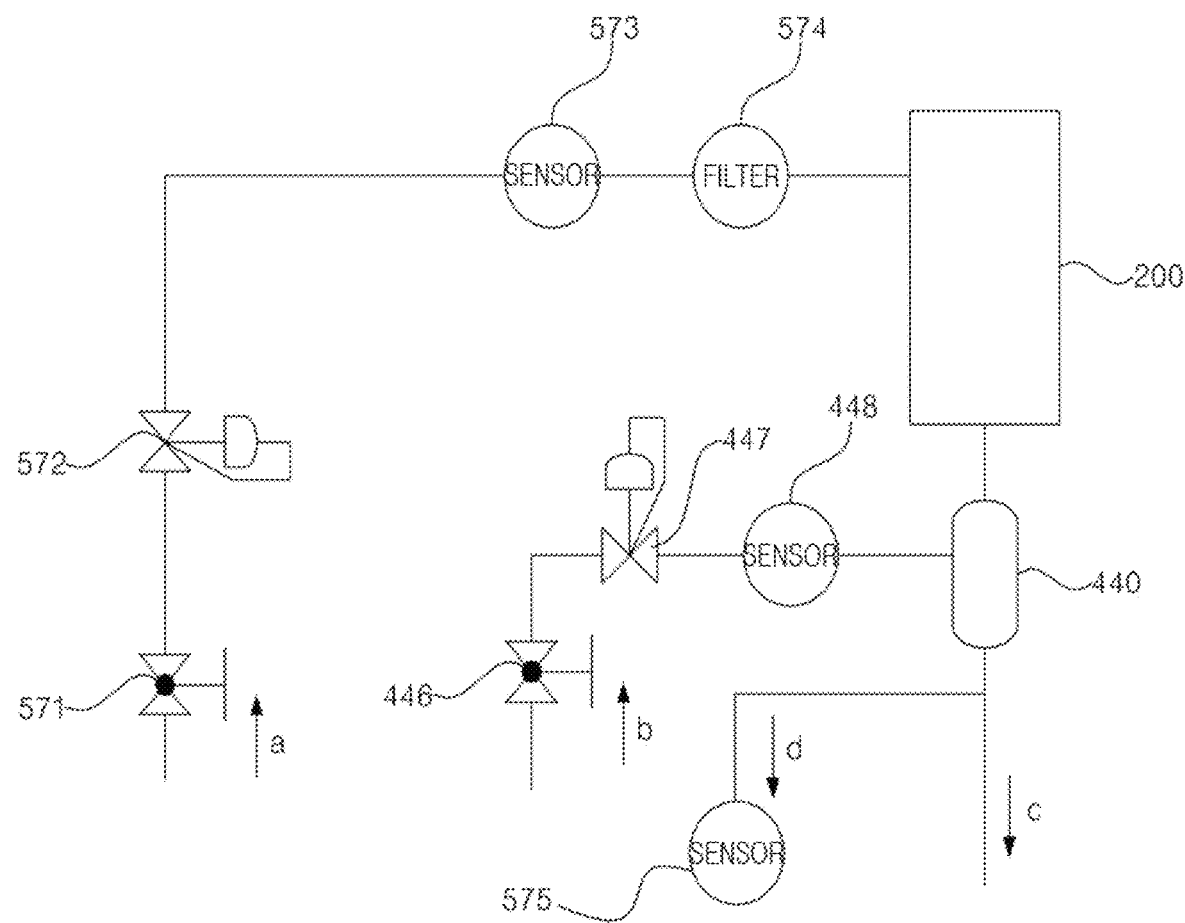

Referring to FIG. 13, a valve 446, a regulator 447, and an air pressure trigger sensor 448 may be additionally provided in said compressed air exhauster as a configuration related to the compressed air. The valve 446 may be a member for opening and closing of the flow path of the compressed air. That is, the valve 446 determines whether the compressed air will be supplied or not. The valve 446, for an example, may be an on/off type valve, but it is not limited to this. It may be a valve like a damper which even controls the amount of the compressed air which is passing through. The regulator 447 may maintain the speed or the amount of the compressed air passing through said regulator 477 constantly. That is, the compressed air may be provided to the compressed air exhauster with a constant amount or a constant speed via through said regulator 447 according to an exemplary embodiment of the present invention. The air pressure trigger sensor 448 may sense the pressure of the compressed air which is supplied to said compressed air exhauster. Said air pressure trigger sensor 448 may be connected to the control unit, and said control unit may output the pressure value measured by said air pressure trigger sensor 448 on the display unit which will be described later. When the measured pressure value is different than the predetermined pressure value, a warning message may be outputted via the alarm output unit.

In addition, a tube 575a, at least a portion thereof is provided inside of the exhausting pump 440 and communicating therewith, may be provided in said exhausting pump 440. Said tube 575a is communicating with the exhausting gas pressure sensor 575 which will be described later, and enables the pressure measurement on the exhausting gas passing through said exhausting pump 440. Said tube 575a may be provided in such a way that the end portion 575b is facing the exhausting direction of the exhausting gas. In this case, a negative pressure is formed in the exhausting gas pressure sensor 575 communicating with the tube 575a, and it is verified that more accurate exhausting pressure is measured than in the case wherein the end portion 575b of the tube 575a is facing the other direction, through a number of experiments The connecting port 450 may connect the second exhausting pipe 430 and the fume outlet 123 of the lower body 120. That is, the fume and the purge gas, which has flowed to the exhausting pump 440 inside of the second exhausting pipe 430 via the connecting port 450, can be exhausted to the outside. Said connecting port 450 is coupled to one side of the fume outlet 123 of the lower body 120, and an outlet pipe (not shown) is provided on the other side so that the fume and the purge gas may be exhausted to the outside.

Figure 12:
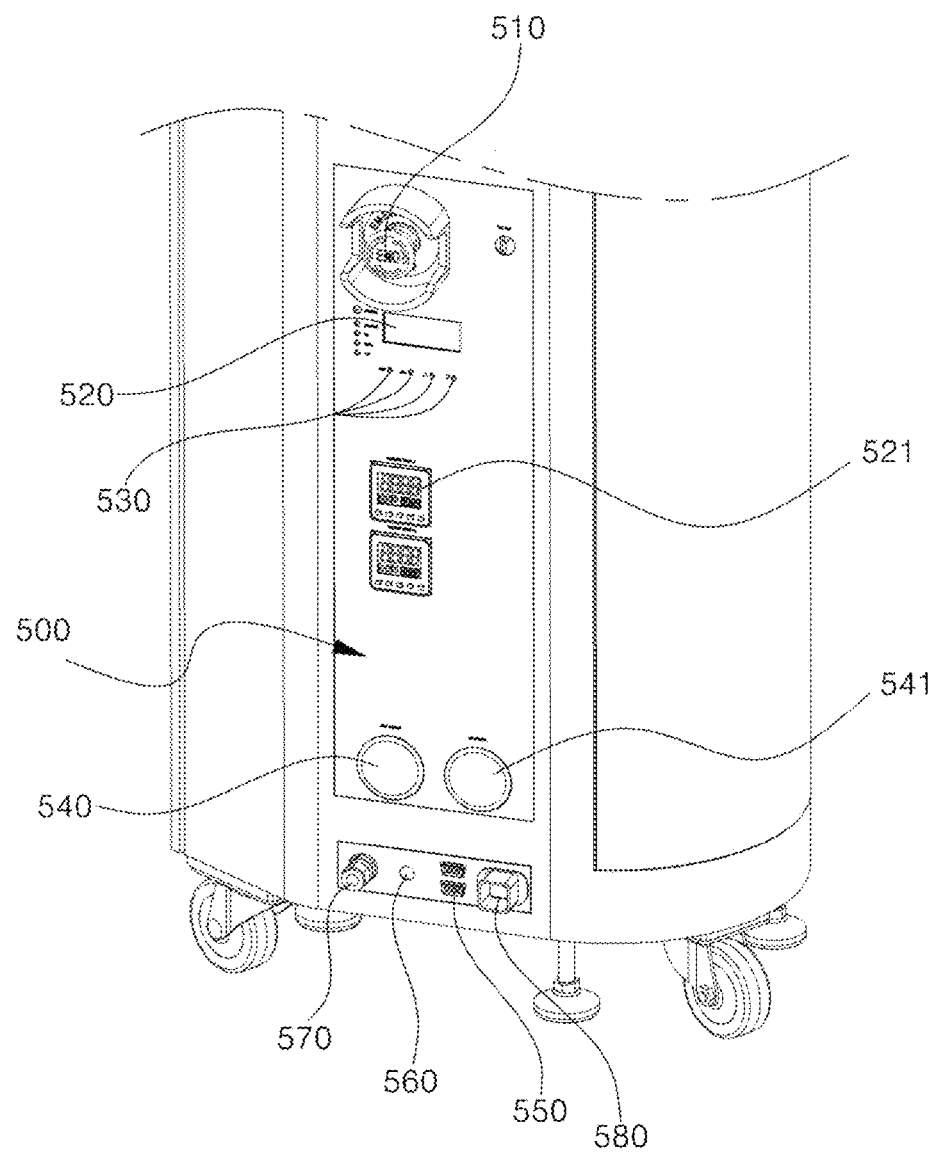
FIG. 12 is a perspective view illustrating an interface unit of an apparatus for removing fume according to an exemplary embodiment of the present invention.

FIG. 12 is a perspective view illustrating an interface unit of an apparatus for removing fume according to an exemplary embodiment of the present invention.

Referring to FIG. 12, an apparatus for removing fume according to an exemplary embodiment of the present invention may further include an interface unit 500.

The interface unit 500 may include many configurations for handling the operation of an apparatus for removing fume according to an exemplary embodiment of the present invention by the users. The interface unit 500, for an example, may be provided on the side surface 121 of the lower body 120, but it is not limited to this.

The interface unit 500, for an example, may include an EMO switch 510, a display unit 520, a compressed air gauge 540, a purge gas gauge 541, a communication port 550, a compressed air connecting port 560, and a purge gas connecting port 570.

An EMO switch 510 may cut off the power immediately in an emergency situation. That is, the EMO switch may be an operation stop button or a power cut-off button used in an emergency situation. That is, when the user presses the EMO switch 510, the purge gas being supplied to the wafer cassette 200, the power being transmitted to the heating component 240, the compressed air being transferred, and the like may be cut off and the operation may be stopped. Of course, a power switch may be provided separately from said EMO switch 510.

The display unit 520 may output the present operation status and the like of the apparatus for removing fume according to an exemplary embodiment of the present invention. The display unit 520 may output, for an example, the measurement values and the like which are measured by the digital leveler, the first sensor 292, the second sensor, and the air pressure trigger sensor 448. The display unit 520 may be functioning as an alarm output unit, and output an alarm message when necessary. Furthermore, the display unit 520 may be controlled by the control unit by being connected thereto. The display unit 520, for an example, is provided as a touch screen and may include the function of the operation control unit 530 which will be described later.

Furthermore, interface unit 500 may further include a heater temperature control unit 521 for controlling the heating member 240, which controls the internal temperature of the wafer cassette 200, and for outputting the temperature of said heating member 240. Said heater temperature control unit 521 may be provided separately from the display unit 520 and the operation control unit 530 which will be described later, but when omitted, the function of said heater temperature control unit 521 may be performed by said display unit 520 and the operation control unit 530.

The operation control unit 530 may be functioned as a means for the user for inputting the instructions in order to control the operation of an apparatus for removing fume according to an exemplary embodiment of the present invention. Through the operation control unit 530, the users may control turning on or off the purge gas and the gas supply pressure (amount supplied, time supplied), the internal temperature of the wafer cassette 200 (operation of the heating member 240), turning on or off the compressed air to the exhausting pump 440 and the air supply pressure, and the like. In addition, it may be configured that the items, which are controlled by the operation control unit 530, are outputted on the display unit 520 so that the user may verify.

The compressed air gauge 540 may output the pressure of the compressed air supplied by the compressed air exhauster, which is an example of the exhausting pump 440 of the exhaust 400. The compressed air gauge 540 is connected to the air pressure trigger sensor 448, and may output the pressure values sensed by said air pressure trigger sensor 448.

The purge gas gauge 541 may output the pressure of the purge gas which is being purged into the inside of the wafer cassette 200. The purge gas gauge 541 is connected to the purge gas pressure sensor 573, and may output the pressure values sensed by said purge gas pressure sensor 573.

The communication port 550 may be provided for communication with the EFED and the semiconductor process main equipments. That is, a communication cable, which is capable of communicating with other equipments, may be connected to the communication port 550.

The compressed air connecting port 560 may be connected to an external compressor for supplying compressed air to said compressed air exhauster. That is, the compressed air discharged from the compressor may be supplied to said compressed air exhauster through the compressed air connecting port 560.

The purge gas connecting port 570 may be connected to an external purge gas supply (not shown) for supplying the purge gas to said wafer cassette 200. That is, the purge gas discharged from the purge gas supply may be supplied to said wafer cassette 200 via the purge gas connecting port 570.

Referring to FIG. 13, an apparatus for removing fume according to an exemplary embodiment of the present invention may further include a valve 571, a regulator 572, a purge gas pressure sensor 573, and a filter 574 as a configuration for supplying the purge gas.

The valve 571 may be a member which opens and closes the flow path of the purge gas. That is, the supply of the purge gas may be determined by the valve 571. The valve 571 may be an on/off type valve, but it is not limited to this, and may be a valve such as a damper which even controls the amount of the purge gas which is passing through. The regulator 572 may constantly maintain the speed or the amount of the purge gas passing through said regulator 572. That is, in the exemplary embodiment of the present invention, the purge gas may be supplied with a constant amount or a constant speed to said wafer cassette 200 through said regulator 572. The purge gas pressure sensor 573 may sense the pressure of the purge gas which is being supplied to said wafer cassette 200. Said purge gas pressure sensor 573 may be connected to the control unit, and said control unit may output the pressure value measured by said purge gas pressure sensor 573 on the display unit which will be described later. When the measured input value is different than the predetermined input value, a warning message may be outputted via the alarm output unit. The filter 574 performs a function for filtering the purge gas which is supplied via the purge gas flow path. For an example, the purge gas being supplied may be nitrogen ($N_2$), in this case, unnecessary fluids may be filtered out by the filter.

Power cables for supplying power to an apparatus for removing fume according to an exemplary embodiment of the present invention may be connected to the power connecting port 580, That is, power can be supplied via said power connecting port 580 to said apparatus for removing fume.

In addition, an apparatus for removing fume according to an exemplary embodiment of the present invention may further include an exhausting gas pressure sensor 575. The exhausting gas pressure sensor 575, at least a portion thereof is connected to the tube 575a provided inside of the exhausting pipe 440, may sense the pressure of the exhausting gas (fume and purge gas) which is exhausted via the exhaust.

An apparatus for removing fume according to an exemplary embodiment of the present invention may further include a control unit. As mentioned above, the control unit may be connected to the components such as the digital leveler, the first sensor 292, the second sensor, the air pressure trigger sensor 448, the purge gas pressure sensor 573, the display unit 520, the operation control unit 530, the alarm output unit, and the like. That is, the control unit may be connected to, read values from, and control various sensors, components for inputting the operation control instructions, components for displaying the operation status, and the like in order to control the operation of the apparatus for removing fume according to an exemplary embodiment of the present invention. Of course, previously unmentioned components also can be controlled by said control unit.

Hereinafter, the operation of an apparatus for removing fume according to an exemplary embodiment of the present invention will be described in detail with reference to the accompanying drawings.

FIG. 13 is a block diagram for explaining the flow path of the purge gas, the compressed air, and the fume inside an apparatus for removing fume according to an exemplary embodiment of the present invention.

First, the heating member 240 provided inside of the wafer cassette 200 operates and sets the internal temperature of the wafer cassette 200 to the predetermined temperature set by the user. In addition, wafers are stacked on the pin 223 of the first wafer support 220 of the wafer cassette 200 and the pin 232 of the second wafer support 230.

Later, a purge gas (e.g. nitrogen gas) is supplied through the purge gas outlet 226 of said first wafer support 220 in order to remove the process gas (fume) remaining on the wafers stacked in the wafer cassette 200. Meanwhile, compressed air is supplied to the compressed air exhauster of the exhaust 400. Supplying of said purge gas and the compressed air will be described in detail with reference to FIG. 13 hereinafter.

First, the supplying process of the purge gas will be described as follows. (a) The purge gas is supplied from the purge gas supply (not shown) via the flow path. The purge gas, which is supplied to said flow path, passes through the valve 571 which opens and closes either automatically or manually, and the pressure thereof is changed in the regulator 572 to a predetermined pressure set by the user. The purge gas pressure sensor 573 senses whether the purge gas is being supplied at the predetermined pressure or not. Then, after filtering by the filter 574, the purge gas is supplied into the wafer cassette 200. More specifically, the purge gas, which is filtered by said filter 574, is flowed to purge gas inlet coupler 270, which is provided on the bottom surface 215 of the cassette 200, via the gas supply path 101a of the body 100. Then, the purge gas passes through the lower gas tube, which is communicating with said purge gas inlet coupler 270, and flows to the side gas tube 282. And, through the purge gas flow path 225 of the stacking shelf 221 of the first wafer support 200, the purge gas is finally exhausted from the purge gas outlet 226. The flow of the purge inside the stacking shelf 221 of the first wafer support 220 will be described more in detail as follows. For an example, the purge gas flow path 225 is provided such that the diameter thereof is getting larger as it is getting closer towards the front (refer to FIG. 8). In this case, more of the purge gas flows to the first purge gas flow path 225b, which is located at the foremost front, and is being exhausted from the purge gas outlet 226b. In this way, since much amount of the purge gas is flowing from the front of the wafer, it is advantageous in that occurrence of dead zone where no purge gas is supplied on the wafer is prevented. Especially, since the second purge gas outlet 226c is provided in the inclined ramp portion 222 which is protruded towards the center of the stacked wafer, it is advantageous in that the purge gas can flow up to the center of the wafer.

The purge gas being exhausted into the inside of the wafer cassette 200 in this way is exhausted through the air suction hole 251 of the punching plate 250 which is provided in the back surface 214 of the wafer cassette 200, together with the process gas (i.e. fume). The fume and the purge gas, which are exhausted through said air suction hole 251, sequentially flow through the upper hopper 260, the lower hopper 410, the first exhausting pipe 420, the second exhausting pipe 430, the exhausting pump 440, and the connecting port 450, and then may be exhausted to the outside. This process and the process of supplying compressed air will be described in detail hereinafter.

(b) The compressed air is discharged from the compressor (not shown) and supplied to the flow path. The purge gas, which is supplied to said flow path, passes through the valve 446 which opens and closes either automatically or manually, and the pressure thereof is changed in the regulator 447 to a predetermined pressure set by the user. The purge gas pressure sensor 448 senses whether the purge gas is being supplied at the predetermined pressure or not. Then, the purge gas is supplied to the compressed air exhauster. The compressed air, which is supplied to said compressed air exhauster, flows through the compressed air transition area 444, and flows into the inside of the first body 441 and the second body 442 via the compressed air outlet 445. The compressed air, which has been flowed into the inside of the first body 441 and the second body 442, flows towards the direction which is determined by the expanded portion 443. That is, referring to FIG. 11, the compressed air, which has been flowed into the inside of the first body 441 and the second body 442, flows downward direction along which the diameter of the expanded portion 443 is increasing. Such flow of the compressed air affects the inside of the wafer cassette 200 which is a communicating space. Thus, when a compressed air having a higher-speed or a higher pressure is supplied to the compressed air exhauster, the speeds of the fume and the purge gas which are exhausted through the punching plate 250 are getting faster as well.

(c) That is, the exhausting speed of the fume and the purge gas inside the wafer cassette 200 is controlled according to the compressed air which is being supplied to the air amplifier, and the fume and the purge gas flow sequentially through the upper hopper 260, the lower hopper 410, the first exhausting pipe 420, the second exhausting pipe 430, the exhausting pump 440, and the connecting port 450, and then would be exhausted to the outside.

(d) In addition, some portion of the fume and the purge gas, which are being exhausted to the outside, may flow into the exhausting gas pressure sensor 575 and be sensed.

Through these series of processes, the fume of the wafers stacked on the wafer cassette 200 can be efficiently removed. Furthermore, the above described series of processes can be performed when the instructions are inputted by the user through the operation control unit 530, and the various numerical values such as the pressure of the purge gas, the pressure of the compressed air, and the like may be controlled. In addition, the operational information may be outputted through the display unit 520, and the user may observe the operation state through the upper body 110, at least a portion of which is transparently provided, and the case 210 of the wafer cassette 200

In the foregoing description, even though all components of the exemplary embodiment are combined as one component or combined to be operated, the present invention is not limited to the exemplary embodiment. In other words, one or more of all components may be selectively combined to be operated without departing from the spirit or scope of the present invention. In addition, unless explicitly described to the contrary, the foregoing terms such as "include" and "comprises" or "having" will be understood to imply the inclusion of stated elements but not the exclusion of any other elements. Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

The description so far is only an example of technical ideas of this present invention, so various permutations, modification, or replacement are possible for people who work in the technical area of the present invention as long as not distracting the original intention of the present invention. Therefore the embodiment disclosed in the present invention and the attached diagrams are not for restricting the technical ideas of the present invention but for explaining and the technical ideas of the present invention are not to be restricted by the embodiment and the attached diagrams. The protected scope of the present invention shall be understood by the scope of claims below, and all technical ideas which reside in the scope of claims shall be included in the rights of the present invention.

Description of Symbols

100: body
200: wafer cassette
300: base plate
400: exhaust
500: interface unit

The invention claimed is:

1. An apparatus for removing fume, comprising:
a wafer cassette for stacking a plurality of wafers;
a front opening for incoming and outgoing of the wafers;
an exhaust for exhausting fume of the wafers; and
a plurality of stacking shelves provided in the wafer cassette, for stacking the wafers vertically,
wherein said plurality of stacking shelves comprise a first stacking shelf supporting a first wafer among the wafers,
wherein said first stacking shelf comprises:
a plate-shaped body;
a purge gas flow path provided in said plate-shaped body in a horizontal direction, said purge gas flow path including a main flow path and branch flow paths branched from said main flow path;
a plurality of purge gas outlets formed on a side surface of said plate-shaped body and connected with said branch flow paths, respectively, for supplying purge gas;
a pin provided on said side surface of said plate-shaped body for directly supporting said first wafer; and
a ramp portion slanted towards a side of said front opening on said side surface of said plate-shaped body,
wherein said plurality of purge gas outlets comprise:
a plurality of first purge gas outlets supplying purge gas; and
a plurality of second gas purge outlets provided in said ramp portion and supplying purge gas towards said front opening.

2. The apparatus for removing fume according to claim 1, wherein said plurality of stacking shelves further comprise a second stacking shelf supporting the first wafer and including a ramp portion, and a width between the ramp portions of the first and second stacking shelves is less than a diameter of the first wafer.

* * * * *